United States Patent [19]
Redman-White et al.

[11] Patent Number: 5,714,894
[45] Date of Patent: Feb. 3, 1998

[54] CURRENT COMPARATOR ARRANGEMENT

[75] Inventors: William Redman-White, West Wellow; Mark Bracey, Southampton, both of England

[73] Assignee: U.S. Philips Corporation, New York, N.Y.

[21] Appl. No.: 567,255

[22] Filed: Dec. 5, 1995

[30] Foreign Application Priority Data

Dec. 8, 1994 [GB] United Kingdom ............... 9424810.1

[51] Int. Cl.$^6$ ............................................. G11C 27/02
[52] U.S. Cl. ......................... 327/94; 327/78; 327/82; 327/88; 327/96
[58] Field of Search ........................... 327/77, 78, 80, 327/82, 88, 93, 94, 95, 96

[56] References Cited

U.S. PATENT DOCUMENTS

| | | | |
|---|---|---|---|
| 3,825,852 | 7/1974 | Pinckaers | 330/261 |
| 3,887,000 | 6/1975 | Pinckaers | 165/255 |
| 4,069,460 | 1/1978 | Sauer | 330/257 |
| 4,114,149 | 9/1978 | Kendall | 340/347 |
| 5,059,832 | 10/1991 | Hughes | 327/94 |
| 5,235,215 | 8/1993 | Davies et al. | 327/193 |
| 5,282,346 | 2/1994 | Davies et al. | 361/103 |
| 5,311,085 | 5/1994 | Pelgrom et al. | 327/94 |

FOREIGN PATENT DOCUMENTS

0608936A2  8/1994  European Pat. Off. ........ G11C 27/02

OTHER PUBLICATIONS

Electronics Letters, vol. 29, No. 16, pp. 1400–1401, Aug. 5, 1993.

*Primary Examiner*—Terry Cunningham
*Attorney, Agent, or Firm*—Leroy Eason

[57] ABSTRACT

A current comparator arrangement has first and second inputs (100, 103), an output (105), and cross-coupled transistors (MP1, MP2) which form a latching circuit. The arrangement also includes current stores (MP3, MP4), the input currents to be compared being fed to the current stores in a selected forward differential order for storage therein during a first portion of a clock period in which the cross-coupled latching circuit is reset. During a second portion of the clock period the input current connections are reversed, thereby reversing their differential order, and the reverse order currents are supplied together with the stored forward order currents to the latching circuit. This cancels common mode and offset currents so that they do not affect the comparison of the input currents.

7 Claims, 2 Drawing Sheets

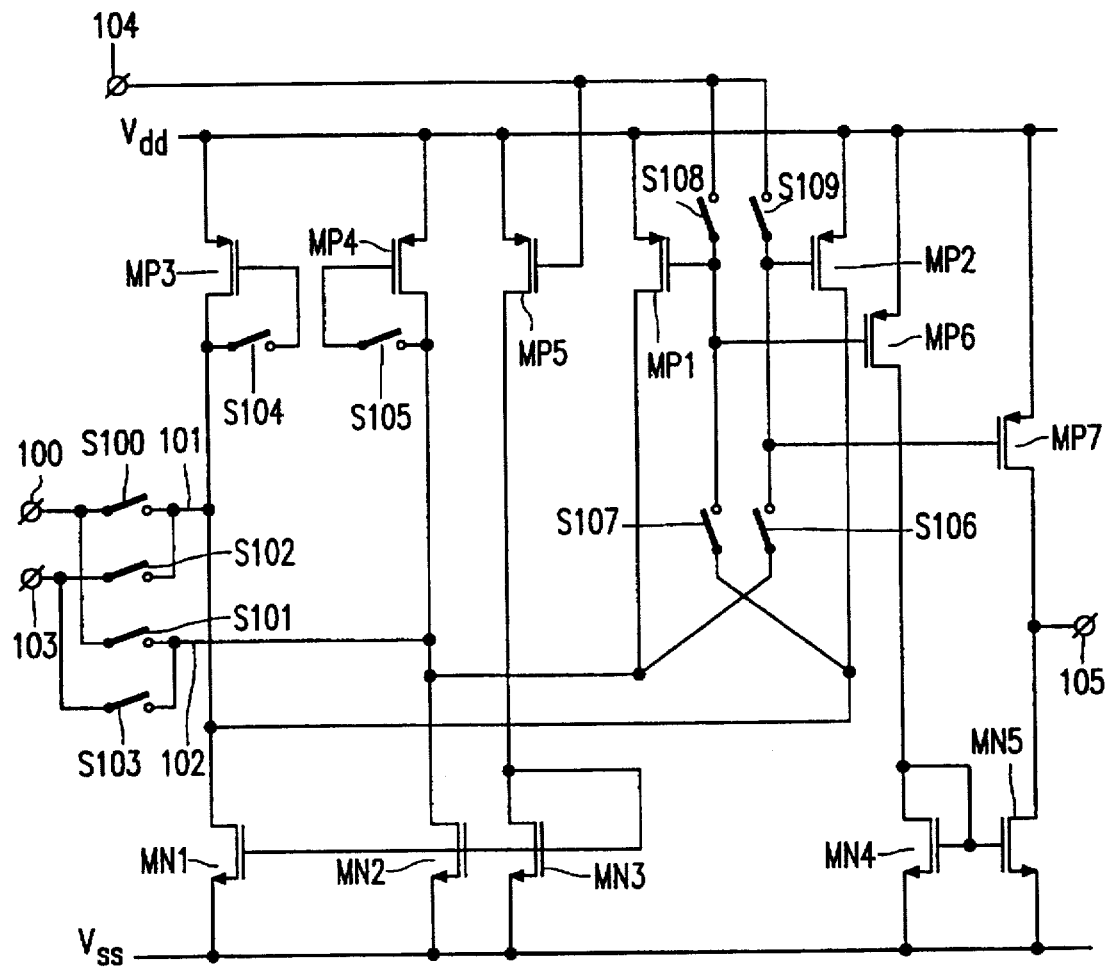
FIG. 3
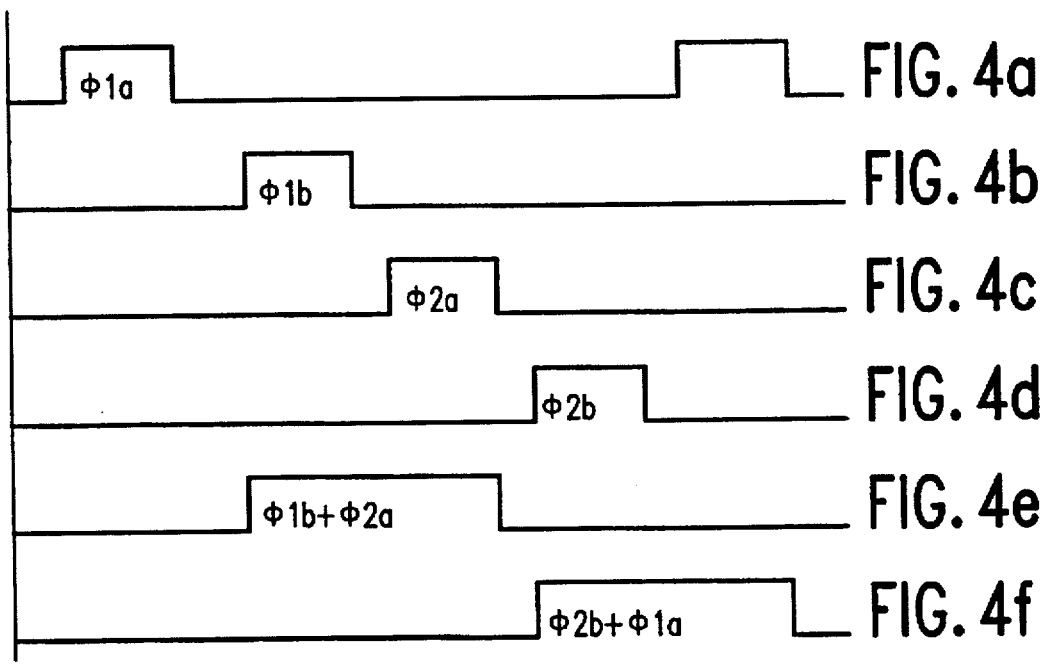
FIG. 4a
FIG. 4b
FIG. 4c
FIG. 4d
FIG. 4e
FIG. 4f

CURRENT COMPARATOR ARRANGEMENT

BACKGROUND OF THE INVENTION

1. Field of the Invention

This invention relates to a current comparator arrangement. The invention has particular, but not exclusive, application in comparing currents produced by S21 current memory cells as disclosed by J B Hughes and K W Moulding in, inter alia, "S21, a switched current technique for high performance," published in Electronics Letters, Vol. 29, No. 16 pages 1400–1401, Aug. 5th 1993.

2. Description of the Related Art

The S21 switched current technique performs current domain signal storage and integration functions with great accuracy. This is based on sampling the signal twice and storing it in coarse and fine memory cells. In the fine phase signals dependent on charge injection from switches and other errors are made negligible. In the fine phase the output signal is defined specifically with respect to the same DC voltage that is the settling value of the fine current store transistor. That is, the gate voltage is set for the bias current value since the fine store is only storing bias voltage plus very small error values. Consequently in order for a comparator to work successfully with this style of circuit it must reference the input signals with respect to a replica of the coarse bias storage voltage.

SUMMARY OF THE INVENTION

It is an object of the invention to provide a comparator circuit which will work successfully with the S21 current memory cells.

The invention provides a current comparator comprising first and second inputs for receiving first and second input currents, first and second current memory circuits for sensing the received input currents during a first phase of a clock period and reproducing said received currents during a second non-overlapping phase of said clock period, first and second cross coupled transistors, means for feeding the stored and received currents to the cross coupled transistors during said second phase, and means for feeding an output of the cross coupled transistors to a latch circuit during the first phase of a succeeding clock period.

Embodiments of the invention will now be described, by way of example, with reference to the accompanying drawings, in which:

BRIEF DESCRIPTION OF THE DRAWINGS

FIG. 3 shows a comparator circuit according to the invention, and

FIGS. 4a-f show clock waveforms used to control the switches in the comparator circuit of FIG. 3.

DETAILED DESCRIPTION OF THE INVENTION

Figure 1:
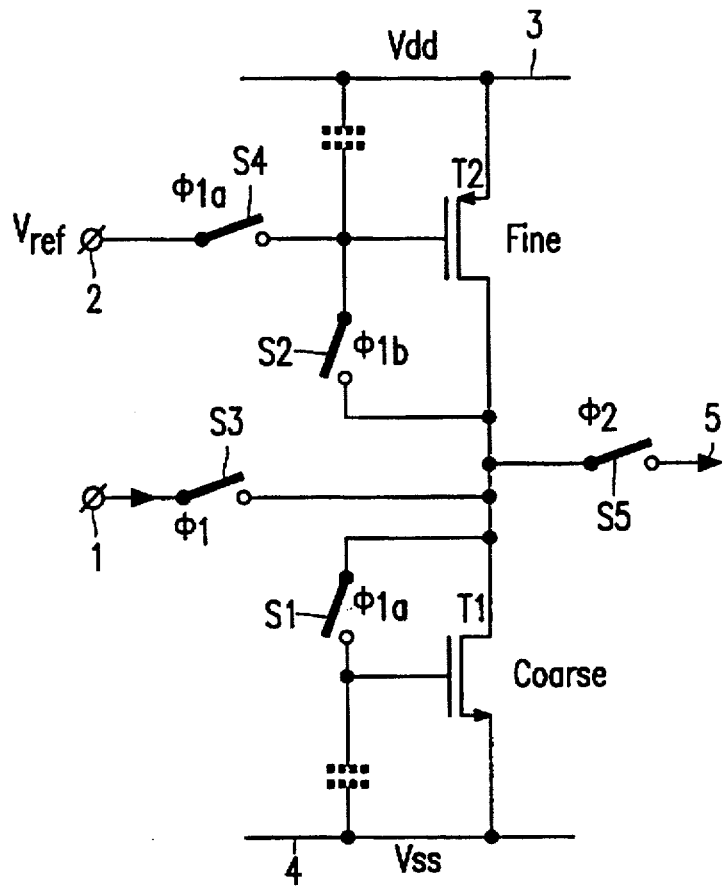
FIG. 1 shows an S21 current memory cell as disclosed in the paper by Hughes and Moulding.

As shown in FIG. 1 the prior art current memory cell comprises a first n channel MOS transistor T1 which has its drain electrode connected to its gate electrode via a switch S1. A second p-channel field effector transistor T2 has its drain electrode connected to its gate electrode via a switch S2. An input terminal 1 is connected via a switch S3 to the junction of the drain electrodes of transistors T1 and T2. A reference voltage is applied to a terminal 2 which is connected via a switch S4 to the gate electrode of transistor T2. The source electrodes of transistors T1 and T2 are connected to opposite supply rails 3 and 4, while an output Terminal 5 is connected via a switch S5 to the junction of the drain electrodes of transistors T1 and T2.

In operation an input current is applied to terminal 1 and during the clock phase $\phi1$ switch S3 is closed. A sub clock phase $\phi1a$ causes switches S1 and S4 to close for a first portion of the period $\phi1$. Thus transistor T1 is connected as a diode and transistor T2 forms a current source, the current produced by transistor T2 being dependent on the value of the reference voltage applied to terminal 2. Transistor T1 at this stage is connected as a diode and hence will conduct the current applied to the input 1 plus the current produced by the current source T2. At the end of the sub clock phase $\phi1a$ switch S1 opens and the current through transistor T1 is maintained at a constant value as the current which originally passed through switch S1 charged the gate source capacitance of transistor T1 and so when switch S1 opens the gate voltage maintains the current through transistor T1. On sub-phase $\phi1b$ the switch S2 closes while the switches S1 and S4 open. Transistor T2 is now connected as a diode and will conduct a current which comprises the input current minus the current stored by transistor T1. Hence the transistor T2 will conduct the error current difference between the input current applied to terminal 1 and that sensed by transistor T1 during the sub phase $\phi1A$. On phase $\phi2$ of the main clock switch S3 opens, switch S5 closes, and the output 5 reproduces the input current i which was applied during phase $\phi1$. A fuller explanation of the operation of and refinements possible to this current memory cell can be found in European Patent Application 0 608 936 which corresponds to U.S. Pat. No. 5,400,273, issued Mar. 21, 1995, assigned to the present assignee.

FIG. 3 shows an embodiment of a current comparator arrangement according to the invention. As shown in FIG. 3 the comparator has a first input 100 which is fed via a switch S100 to a line 101 and via a switch S101 to a line 102. A second input 103 is fed via a switch S102 to the line 101 and via a switch 103 to the line 102. The line 101 is connected to the drain electrode of a transistor MP3 while a switch S104 is connected between the drain and gate electrodes of transistor MP3. The line 101 is further connected to the drain electrode of a transistor MP2 and to the drain electrode of a transistor MP1. The line 102 is connected to the drain electrode of a transistor MP4 and via a switch S105 to its gate electrode. The line 102 is further connected to the drain electrode of a transistor MN2 and to the drain electrode of a transistor MP1. The gate electrode of transistor MP2 is connected via a switch S106 to the drain electrode of transistor MP1, while the gate electrode of transistor MP1 is connected via a switch S107 to the drain electrode of transistor MP2. The source electrodes of transistors MP1 to MP4 are connected to a supply rail $V_{dd}$ while the source electrodes of transistors MN1 and MN2 are connected to a supply rail $V_{ss}$. An input terminal 104 is connected to the gate electrode of a transistor MP5 and via a switch S108 to the gate electrode of transistor MP1 and a switch S109 to the gate electrode of the transistor MP2.

The drain electrode of the transistor MP5 is connected to the drain and gate electrodes of a transistor MN3. The gate electrode of transistor MN3 is connected to the gate electrodes of transistors MN1 and MN2. The source electrode of transistor MN3 is connected to the supply rail $V_{ss}$ while the source electrode of transistor MP5 is connected to the supply rail $V_{dd}$.

The gate electrode of transistor MP1 is connected to the gate electrode of a transistor MP6 while the gate electrode of transistor MP2 is connected to the gate electrode of a transistor MP7. The drain electrode of transistor MP6, is connected to the drain and gate electrodes of a transistor MN4, while the drain electrode of the transistor MP7 is connected to the drain electrode of a transistor MN5. The gate electrodes of transistors MN4 and MN5 are connected together. The junction of the drain electrodes of transistors MP7 and MN5 are connected to an output terminal 105. The source electrodes of transistors MP6 and MP7 are connected to the supply rail $V_{dd}$ while the source electrodes of transistors MN4 and MN5 are connected to the supply rail $V_{ss}$.

Figure 2:
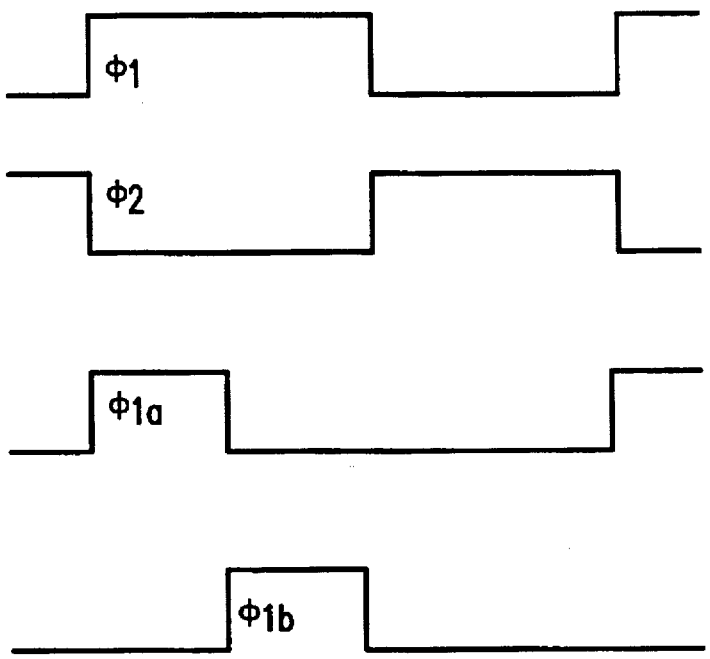
FIG. 2 shows clock waveforms used to operate the switches in the current memory cell of FIG. 1.

FIG. 4 shows clock waveforms which are used to operate the switches in the comparator, the switches being closed when the clockwave form goes high. Waveform a operates switches S100, S103, S104 and S105, waveform b operates switches S101 and S102, waveform e operates switches S106 and S107 and waveform f operates switches S108 and S109. In FIG. 4 waveforms a and b correspond to the waveforms $\phi 1a$ and $\phi 1b$ of FIG. 2. Waveforms c and d are correspondingly a waveform $\phi 2a$ and $\phi 2b$ while waveform e is $\phi 1b$ and $\phi 2a$ and waveform f is $\phi 2b$ and $\phi 1a$.

The arrangement shown in FIG. 3 comprises a cross coupled transistor pair MP1 and MP2 which form a latch biased by means of two current sources MN1 and MN2. The current sources produce a current of value 2J each, where J has the same value as the bias currents in the memory cells shown in FIG. 1. Resetting the latch could be achieved by means of a switch shorting the cross coupled transistor pair MP1 and MP2 during the first part of $\phi 1$ denoted $\phi 1a$. However in this embodiment we use a bias reference transistor MP5 to set the current in transistors MP1 and MP2 to be equal to J which is the equivalent of the current density in the associated S21 memory cells. Hence the input voltage defined by the comparator while it is sampling the outputs from S21 memory cells during phase $\phi 1a$ and $\phi 1b$ is identical to the nominal settling voltage of the fine current store itself, thereby minimizing errors in current transfer. The difference current between that in MN1/MN2 and MP1/MP2, including any offset from the ideal 2:1 ratio, is carried by two sample current store transistors MP3 and MP4. This value together with the input signal is sensed during the period $\phi 1a$. During the second part of $\phi 1$ denoted $\phi 1b$ the input current store switches are opened, that is switches S104 and S105. Consequently it stores the differential input signal in one sense Idm, its common mode component Icm, and any offset currents. During $\phi 1b$ the latch transistors MP1 and MP2 are cross coupled by switches S106 and S107. The input signal switches S102 and S103 are closed so that the input currents are applied in the opposite sense, that is applying a differential input current with a reversed sign-Idm together with the common mode current Icm. The current stores MP3 and MP4 are now acting as current sources and a difference current of plus 2Idm is applied to the latch. The common mode and offset are thus absorbed in the current sources MP3 and MP4. The latch now moves to its decision at a rate governed by the $C/g_m$ time constants. An output may be taken at the end of phase $\phi 1b$. A longer latching period $\phi 1b$ and $\phi 2a$ may be used. This later phasing is required for very high speed operation or for compatibility with S21 current stores.

For correct operation of the comparator the output level translator comprising transistors MN4 and MN5 to-gether with transistors MP6 and MP7 needs to be constructed so that during the reset period both transistors MP6 and MP7 are in the same state until the latch is substantially set, i.e. capacitances are balanced throughout the switching regime. This can be achieved by making the channel width to length ratio of transistor MN5 greater than that of transistor MN4. Consequently during reset the output 105 is always low.

From reading the present disclosure, other modifications will be apparent to persons skilled in the art. Such modifications may involve other features which are already known in the design, manufacture and use of current comparator arrangements and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A current comparator comprising: first and second inputs for receiving first and second input currents which are to be compared; first and second current memory circuits for sensing and storing the received input currents provided by a switching means in a selected forward order during a first phase of a clock period and reproducing the stored currents in said forward order during a second non-overlapping phase of said clock period; first and second cross-coupled transistors forming a latching circuit said; switching means further providing the received currents in reverse order during said second phase; means for feeding the stored forward order currents combined with the reverse order currents to the latching circuit during said second phase; and means for coupling an output of the latching circuit to an output of said comparator during the first phase of a succeeding clock period.

2. A current comparator as claimed in claim 1, wherein during said first phase the input currents are sensed and stored by the current memory circuits, during said second phase the input currents are reversed in order and fed together with the outputs from the current memory circuit to the transistors of the latching circuit, during a third phase the comparison result is available from the latching circuit, and during a final phase the latching circuit is reset to its initial state.

3. A current comparator as claimed in claim 1, further comprising means for resetting the latching circuit; said resetting means comprising first switching means for disconnecting the cross coupling of said transistors and second switching means for connecting the transistors as current sources having a common biasing means during the second phase of the next succeeding clock period.

4. A current comparator comprising: first and second inputs for receiving first and second input currents which are to be compared; first and second current memory circuits for sensing and storing the received input currents provided by means for applying in a selected forward order during a first clock period and reproducing the stored currents in said forward order during a second clock period; a latch circuit having an output said; means for applying further applying to said latch circuit during said second clock period both said input currents in reverse order together with said input currents in forward order as reproduced from said current memories; means for applying, during a third clock period, the output of the latch circuit to an output of the current comparator as a comparison result produced thereby; and means for resetting the current comparator to its initial state during a fourth clock period.

5. A current comparator as claimed in claim 4, in which said latch circuit comprises cross coupled transistors and said means for resetting comprises first switching means for disconnecting the cross coupling of the transistors and second switching means for connecting the transistors as current sources having a common biasing means during a second phase of the next succeeding clock period.

6. A current comparator as claimed in claim 4, in which said means for applying comprises a changeover switching arrangement which is operative to provide reversal of connections between the first and second inputs and the latch circuit.

7. A current comparator as claimed in claim 5, in which said means for applying comprises a changeover switching arrangement which is operative to provide reversal of connections between the first and second inputs and the latch circuit.

* * * * *